United States Patent
Butler

(10) Patent No.: US 7,349,101 B2
(45) Date of Patent: Mar. 25, 2008

(54) LITHOGRAPHIC APPARATUS, OVERLAY DETECTOR, DEVICE MANUFACTURING METHOD, AND DEVICE MANUFACTURED THEREBY

(75) Inventor: Hans Butler, Best (NL)

(73) Assignee: ASML Netherlands B.V., Veldhoven (NL)

( * ) Notice: Subject to any disclaimer, the term of this patent is extended or adjusted under 35 U.S.C. 154(b) by 414 days.

(21) Appl. No.: 10/747,654

(22) Filed: Dec. 30, 2003

(65) Prior Publication Data

US 2005/0140986 A1 Jun. 30, 2005

(51) Int. Cl.
*G01B 11/02* (2006.01)
(52) U.S. Cl. ........................... 356/509; 356/494
(58) Field of Classification Search ........ 356/399–401, 356/488, 494, 509, 521; 250/559.37
See application file for complete search history.

(56) References Cited

U.S. PATENT DOCUMENTS

| | | | |
|---|---|---|---|
| 4,703,434 A * | 10/1987 | Brunner | 356/509 |
| 4,980,718 A * | 12/1990 | Salter et al. | 355/53 |
| 5,225,039 A * | 7/1993 | Ohguri | 438/32 |
| 5,229,872 A | 7/1993 | Mumola | |
| 5,296,891 A | 3/1994 | Vogt et al. | |
| 5,343,292 A * | 8/1994 | Brueck et al. | 356/509 |
| 5,506,684 A * | 4/1996 | Ota et al. | 356/401 |
| 5,523,193 A | 6/1996 | Nelson | |
| 5,583,609 A * | 12/1996 | Mizutani et al. | 356/401 |
| 5,751,403 A * | 5/1998 | Mizutani et al. | 356/401 |
| 5,754,341 A * | 5/1998 | Takata et al. | 250/237 G |
| 5,969,441 A | 10/1999 | Loopstra et al. | |
| 6,046,792 A | 4/2000 | Van Der Werf et al. | |

FOREIGN PATENT DOCUMENTS

| | | |
|---|---|---|
| WO | 98/33096 | 7/1998 |
| WO | 98/38597 | 9/1998 |
| WO | 98/40791 | 9/1998 |

\* cited by examiner

*Primary Examiner*—Gregory J. Toatley, Jr.
*Assistant Examiner*—Patrick Connolly
(74) *Attorney, Agent, or Firm*—Pillsbury Winthrop Shaw Pittman LLP

(57) ABSTRACT

A device according to one embodiment of the invention may be applied to measure the overlay (e.g. as a machine performance number) quickly and over an expanded range of locations (possibly everywhere) on a wafer. One method using such a device includes measuring the amplitude of a diffraction order of a diffraction pattern that results from interference between a pattern on wafer level and a pattern that is projected on the pattern on wafer level. The pattern that is projected may be present, for example, at reticle level.

28 Claims, 7 Drawing Sheets

LITHOGRAPHIC APPARATUS, OVERLAY DETECTOR, DEVICE MANUFACTURING METHOD, AND DEVICE MANUFACTURED THEREBY

FIELD OF THE INVENTION

The present invention relates to lithographic apparatus and methods.

BACKGROUND

The term "patterning structure" as here employed should be broadly interpreted as referring to any structure or field that may be used to endow an incoming radiation beam with a patterned cross-section, corresponding to a pattern that is to be created in a target portion of a substrate; the term "light valve" can also be used in this context. It should be appreciated that the pattern "displayed" on the patterning structure may differ substantially from the pattern eventually transferred to e.g. a substrate or layer thereof (e.g. where pre-biasing of features, optical proximity correction features, phase and/or polarization variation techniques, and/or multiple exposure techniques are used). Generally, such a pattern will correspond to a particular functional layer in a device being created in the target portion, such as an integrated circuit or other device (see below). A patterning structure may be reflective and/or transmissive. Examples of patterning structure include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind; in this manner, the beam becomes patterned according to the addressing pattern of the matrix-addressable surface. An array of grating light valves (GLVs) may also be used in a corresponding manner, where each GLV may include a plurality of reflective ribbons that can be deformed relative to one another (e.g. by application of an electric potential) to form a grating that reflects incident light as diffracted light. A further alternative embodiment of a programmable mirror array employs a matrix arrangement of very small (possibly microscopic) mirrors, each of which can be individually tilted about an axis by applying a suitable localized electric field, or by employing piezoelectric actuation means. For example, the mirrors may be matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described hereabove, the patterning structure can comprise one or more programmable mirror arrays. More information on mirror arrays as here referred to can be gleaned, for example, from U.S. Pat. No. 5,296,891 and No. 5,523,193 and PCT patent applications WO 98/38597 and WO 98/33096, which documents are incorporated herein by reference. In the case of a programmable mirror array, the support structure may be embodied as a frame or table, for example, which may be fixed or movable as required.

A programmable LCD panel. An example of such a construction is given in U.S. Pat. No. 5,229,872, which is incorporated herein by reference. As above, the support structure in this case may be embodied as a frame or table, for example, which may be fixed or movable as required.

A support structure may be provided to support (i.e. to bear the weight of) the patterning structure. The support structure may hold the patterning structure in a manner that may depend on the orientation of the patterning structure, the design of the lithographic apparatus, and/or other conditions (such as, for example, whether or not the patterning structure is held in a vacuum environment). The support can be performed using mechanical clamping, vacuum, or other clamping techniques (for example, electrostatic clamping under vacuum conditions). The support structure may be a frame or a table, for example, which may be fixed or movable as required and which may ensure that the patterning structure is at a desired position (for example, with respect to the projection system).

For purposes of simplicity, the rest of this text may, at certain locations, specifically direct itself to examples involving a mask (or "reticle") and mask table (or "reticle table"); however, the general principles discussed in such instances should be seen in the broader context of the patterning structure as hereabove set forth.

A lithographic apparatus may be used to apply a desired pattern onto a surface (e.g. a target portion of a substrate). Lithographic projection apparatus can be used, for example, in the manufacture of integrated circuits (ICs). In such a case, the patterning structure may generate a circuit pattern corresponding to an individual layer of the IC, and this pattern can be imaged onto a target portion (e.g. comprising one or more dies (or "chips") and/or portion(s) thereof) on a substrate (e.g. a wafer of silicon or other semiconductor material) that has been coated with a layer of radiation-sensitive material (e.g. resist). In general, a single wafer will contain a whole matrix or network of adjacent target portions that are successively irradiated via the projection system (e.g. one at a time).

Among current apparatus that employ patterning by a mask on a mask table, a distinction can be made between two different types of machine. In one type of lithographic projection apparatus, each target portion is irradiated by exposing the entire mask pattern onto the target portion at once; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. A projection beam in a scanning type of apparatus may have the form of a slit with a slit width in the scanning direction. More information with regard to lithographic devices as here described can be gleaned, for example, from U.S. Pat. No. 6,046,792, which is incorporated herein by reference.

In a manufacturing process using a lithographic projection apparatus, a pattern (e.g. in a mask) is imaged onto a substrate that is at least partially covered by a layer of radiation-sensitive material (e.g. resist). Prior to this imaging procedure, the substrate may undergo various other procedures such as priming, resist coating, and/or a soft bake. After exposure, the substrate may be subjected to other procedures such as a post-exposure bake (PEB), development, a hard bake, and/or measurement/inspection of the imaged features. This set of procedures may be used as a basis to pattern an individual layer of a device (e.g. an IC). For example, these transfer procedures may result in a patterned layer of resist on the substrate. One or more pattern processes may follow, such as deposition, etching, ion-implantation (doping), metallization, oxidation, chemomechanical polishing, etc., all of which may be intended to create, modify, or finish an individual layer. If several layers are required, then the whole procedure, or a variant thereof, may be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

A substrate as referred to herein may be processed before or after exposure: for example, in a track (a tool that typically applies a layer of resist to a substrate and develops the exposed resist) or a metrology or inspection tool. Where applicable, the disclosure herein may be applied to such and other substrate processing tools. Further, the substrate may be processed more than once (for example, in order to create a multi-layer IC), so that the term substrate as used herein may also refer to a substrate that already contains multiple processed layers.

The term "projection system" should be broadly interpreted as encompassing various types of projection system, including refractive optics, reflective optics, catadioptric systems, and charged particle optics, for example. A particular projection system may be selected based on factors such as a type of exposure radiation used, any immersion fluid(s) or gas-filled areas in the exposure path, whether a vacuum is used in all or part of the exposure path, etc. For the sake of simplicity, the projection system may hereinafter be referred to as the "lens." The radiation system may also include components operating according to any of these design types for directing, shaping, reducing, enlarging, patterning, and/or otherwise controlling the projection beam of radiation, and such components may also be referred to below, collectively or singularly, as a "lens."

Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and PCT Application No. WO 98/40791, which documents are incorporated herein by reference.

The lithographic apparatus may also be of a type wherein the substrate is immersed in a liquid having a relatively high refractive index (e.g. water) so as to fill a space between the final element of the projection system and the substrate. Immersion liquids may also be applied to other spaces in the lithographic apparatus, for example, between the mask and the first element of the projection system. The use of immersion techniques to increase the effective numerical aperture of projection systems is well known in the art.

In the present document, the terms "radiation" and "beam" are used to encompass all types of electromagnetic radiation or particle flux, including ultraviolet radiation (e.g. with a wavelength of 365, 248, 193, 157 or 126 nm), EUV (extreme ultra-violet radiation, e.g. having a wavelength in the range 5-20 nm), and X-rays, as well as particle beams (such as ion or electron beams).

Although specific reference may be made in this text to the use of lithographic apparatus in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, DNA analysis devices, etc. The skilled artisan will appreciate that, in the context of such alternative applications, any use of the terms "reticle," "wafer," or "die" in this text should be considered as being replaced by the more general terms "mask," "substrate," and "target portion" (or "exposure area"), respectively.

Dies or "chips" produced using a lithographic apparatus may include a number of layers applied on top of each other. In a lithographic apparatus, the "overlay" is an indication of how well subsequent layers overlap each other. The term "overlay" generally actually refers to the overlay error; an overlay of zero means that the two layers overlap perfectly. The overlay error of a current lithographic machine lies in the order of 10 nm.

The overlay is a performance number for a lithographic apparatus. A deterioration in overlay means a degradation in performance and may result in an increase of improperly produced chips in the lithographic apparatus. Therefore, especially at a chip production site, the overlay may be frequently measured. It may be desirable to improve current devices and methods for measuring overlay.

SUMMARY

A measurement device according to one embodiment of the invention includes a first object having a first pattern; a second object having a second pattern corresponding to the first pattern; a projection system configured to project an image of the first pattern onto the second pattern; and a detector configured to measure an amplitude of at least one order of a diffraction pattern resulting from an interference of the second pattern and the projected image. Modifications of such a device, and overlay detectors and lithographic apparatus including such devices, are also disclosed.

A method for measurement according to an embodiment of the invention includes illuminating a first object having at least a first pattern; projecting an image of the first pattern onto a second object having a second pattern corresponding to the first pattern; and measuring an amplitude of at least one order of a diffraction pattern resulting from interference between the second pattern and the projected image. Methods for determining overlay, for calibration, and for device manufacturing including such operations are also disclosed.

BRIEF DESCRIPTION OF THE DRAWINGS

Embodiments of the invention will now be described, by way of example only, with reference to the accompanying schematic drawings in which.

In the Figures, corresponding reference symbols indicate corresponding parts.

DETAILED DESCRIPTION

Embodiments of the invention include, for example, apparatus and methods that may be used to measure overlay in a lithographic apparatus that may provide overlay information with enhanced resolution, be more accurate, and/or operate more quickly and/or smoothly than presently known devices.

Figure 1:
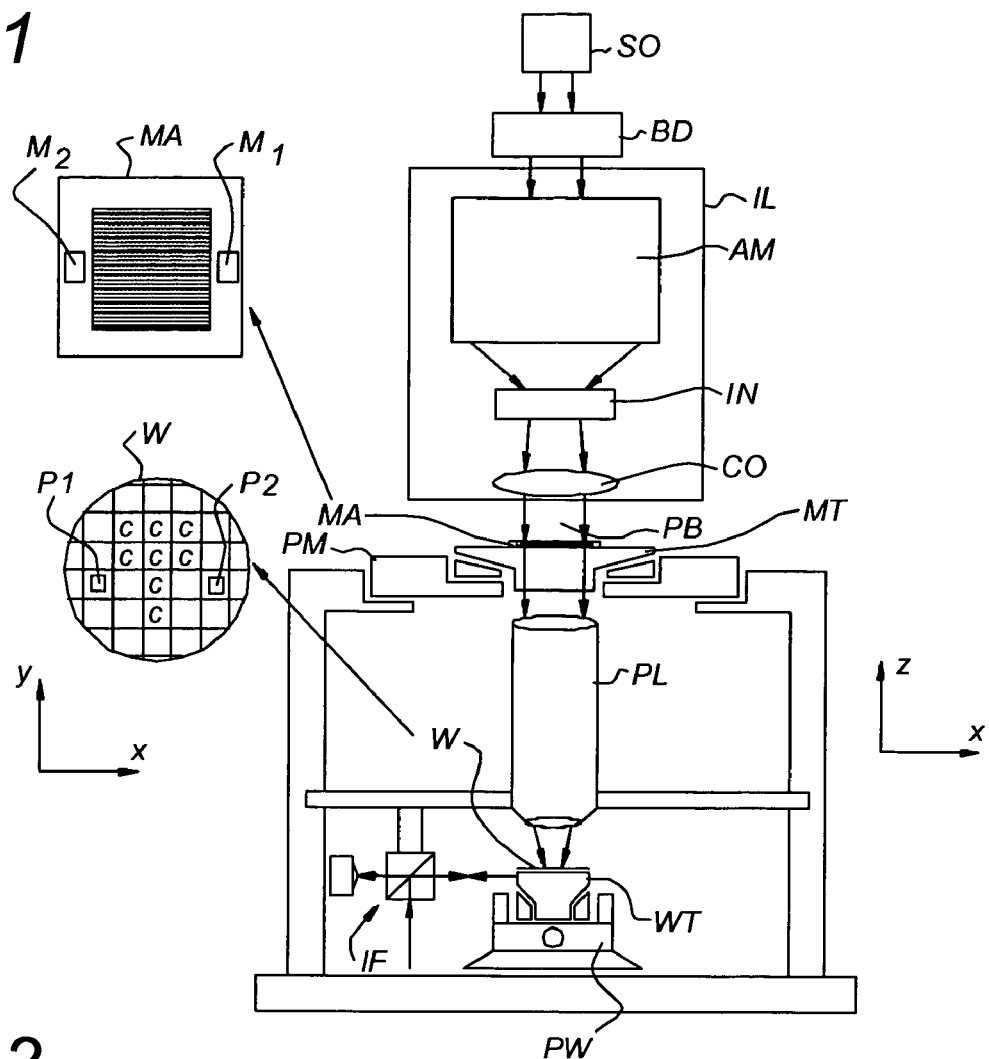
FIG. 1 depicts a lithographic apparatus according to an embodiment of the invention.

FIG. 1 schematically depicts a lithographic projection apparatus according to a particular embodiment of the invention. The apparatus comprises:

A radiation system configured to supply (e.g. having structure capable of supplying) a projection beam of radiation (e.g. UV or EUV radiation). In this particular example, the radiation system RS comprises a radiation source SO, a beam delivery system BD, and an illumination system including adjusting structure AM for setting an illumination node, an integrator IN, and condensing optics CO.

A support structure configured to support a patterning structure capable of patterning the projection beam. In this example, a first object table (mask table) MT is provided with a mask holder for holding a mask MA (e.g. a reticle), and is connected to a first positioning structure for accurately positioning the mask with respect to item PL;

A second object table (substrate table) configured to hold a substrate. In this example, substrate table WT is provided with a substrate holder for holding a substrate W (e.g. a resist-coated semiconductor wafer), and is connected to a second positioning structure for accurately positioning the substrate with respect to item PL and (e.g. interferometric) measurement structure IF, which is configured to accurately indicate the position of the substrate and/or substrate table with respect to lens PL; and A projection system ("lens") configured to project the patterned beam. In this example, projection system PL (e.g. a refractive lens group, a catadioptric or catoptric system, and/or a mirror system) is configured to image an irradiated portion of the mask MA onto a target portion C (e.g. comprising one or more dies and/or portion(s) thereof) of the substrate W. Alternatively, the projection system may project images of secondary sources for which the elements of a programmable patterning structure may act as shutters. The projection system may also include a microlens array (MLA), e.g. to form the secondary sources and to project microspots onto the substrate.

As here depicted, the apparatus is of a transmissive type (e.g. has a transmissive mask). However, in general, it may also be of a reflective type, for example (e.g. with a reflective mask). Alternatively, the apparatus may employ another kind of patterning structure, such as a programmable mirror array of a type as referred to above.

The source SO (e.g. a mercury lamp, an excimer laser, an electron gun, a laser-produced plasma source or discharge plasma source, or an undulator provided around the path of an electron beam in a storage ring or synchrotron) produces a beam of radiation. This beam is fed into an illumination system (illuminator) IL, either directly or after having traversed a conditioning structure or field. For example, a beam delivery system BD may include suitable directing mirrors and/or a beam expander. The illuminator IL may comprise an adjusting structure or field AM for setting the outer and/or inner radial extent (commonly referred to as σ-outer and σ-inner, respectively) of the intensity distribution in the beam, which may affect the angular distribution of the radiation energy delivered by the projection beam at, for example, the substrate. In addition, the apparatus will generally comprise various other components, such as an integrator IN and a condenser CO. In this way, the beam PB impinging on the mask MA has a desired uniformity and intensity distribution in its cross-section.

It should be noted with regard to FIG. 1 that the source SO may be within the housing of the lithographic projection apparatus (as is often the case when the source SO is a mercury lamp, for example), but that it may also be remote from the lithographic projection apparatus, the radiation beam which it produces being led into the apparatus (e.g. with the aid of suitable direction mirrors); this latter scenario is often the case when the source SO is an excimer laser. The current invention and claims encompass both of these scenarios.

The beam PB subsequently intercepts the mask MA, which is held on a mask table MT. Having traversed (alternatively, having been selectively reflected by) the mask MA, the beam PB passes through the lens PL, which focuses the beam PB onto a target portion C of the substrate W. With the aid of the second positioning structure (and interferometric measuring structure IF), the substrate table WT can be moved accurately, e.g. so as to position different target portions C in the path of the beam PB. Similarly, the first positioning structure can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator (e.g. to make fine adjustments in mask orientation and position) or may be fixed. Mask MA and substrate W may be aligned using mask alignment marks M1, M2 and substrate alignment marks P1, P2.

The depicted apparatus can be used in several different modes:

1. In step mode, the mask table MT is kept essentially stationary, and an entire mask image is projected at once (i.e. in a single "flash") onto a target portion C. The substrate table WT is then shifted in the x and/or y directions so that a different target portion C can be irradiated by the beam PB. In step mode, a maximum size of the exposure field may limit the size of the target portion imaged in a single static exposure;

2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image. Concurrently, the substrate table WT is simultaneously moved in the same or opposite direction at a speed V=Mv, in which M is the magnification of the lens PL (typically, M=¼ or ⅕). The velocity and/or direction of the substrate table WT relative to the mask table MT may be determined by magnification, demagnification (reduction), and/or image reversal characteristics of the projection system PL. In this manner, a relatively large target portion C can be exposed, without having to compromise on resolution. In scan mode, a maximum size of the exposure field may limit the width (in the non-scanning direction) of the target portion exposed in a single dynamic exposure, whereas the length of the scanning motion may determine the height (in the scanning direction) of the target portion exposed;

3. In another mode, the mask table MT is kept essentially stationary holding a programmable patterning structure, and the substrate table WT is moved or scanned while a pattern imparted to the projection beam is projected onto a target portion C. In this mode, generally a pulsed radiation source is employed and the programmable patterning structure is updated as required after each movement of the substrate table WT or in between successive radiation pulses during a scan. This mode of operation can be readily applied to maskless lithography that utilizes programmable patterning structure, such as a programmable mirror array of a type as referred to above.

Combinations of and/or variations on the above-described modes of use or entirely different modes of use may also be employed.

Although a development as described in this application may in fact measure an ability of a lithographic machine to make subsequent layers overlap each other, the result from such a measurement may be correlated to the overlay (except for, for instance, process conditions deviating from the norm). The term overlay as used in this application thus also refers to such an ability.

As is known from U.S. Pat. No. 4,703,434, the overlay can be measured in the following manner. A grating mask and a corresponding matching grating wafer are loaded into a lithographic apparatus. The grating mask is illuminated by a beam from a source of light: for example, by a beam which locally on the grating mask has the form of an arcuate slit (i.e. a slit having the shape of an arc). The resulting patterned beam (i.e. the beam as it is after its interaction with the grating mask) is projected on the grating wafer. The projection of the patterned beam on the grating wafer results in a fringe pattern (so-called Moire fringes). These Moire fringes can be observed by suitable viewing optics.

Figure 2:
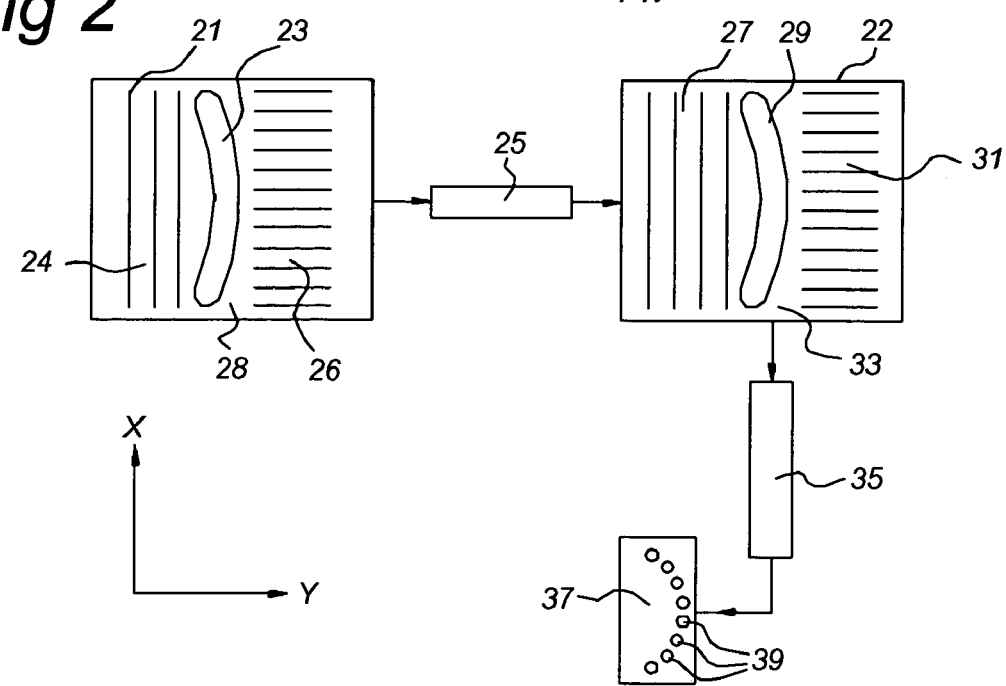
FIG. 2 shows devices for measuring overlay.

The fringe intensity may be a periodic function of the displacement between mask and wafer or the overlay perpendicular to the grating lines. In order to measure the overlay in multiple directions, it may be desirable or necessary to arrange the grating lines accordingly in multiple directions, for example as shown in FIG. 2 of U.S. Pat. No. 4,703,434. That figure shows a die that is scanned in a vertical direction with reference to the plane of the page. The die comprises two arrays of grating lines that are differently oriented to enable determination of overlay in two different directions.

Between the arrays, an unpatterned region is present that has a width of at least the width of the slit. This region presents a disadvantage, since for this region as a consequence it may not be practical or possible to determine the overlay error. This region can even be relatively large, due e.g. to the fact that the slit is arcuate in shape, and it may be desirable or necessary for the vertical dimension of this region to be at least as large as the maximum size of the slit in this direction.

Another potential disadvantage of a technique as described in U.S. Pat. No. 4,703,434 is that to obtain useable Moire fringes, the grating lines may be required to stretch over the complete width of the slit. This condition means that it may not be practical or possible to accommodate, for instance, an X grating and an Y grating (X grating and Y grating meaning a grating from which the overlay in the X, respectively the Y, direction can be derived) in the slit simultaneously. This may prohibit measuring overlay in the X direction and Y direction in adjacent parts of the die.

Further potential disadvantages of a technique as described in U.S. Pat. No. 4,703,434 are that it may not be practical or possible to measure the overlay "on line," which may make it a time consuming operation, and that the overlay data acquired may be relatively limited in accuracy. By measuring overlay "on line" (or "on the fly"), it is meant in this application that the overlay is measured while scanning in an exposure-like fashion though an illumination beam of a lithographic apparatus. The detector used in U.S. Pat. No. 4,703,434 is a relatively complex array of photodiodes, which may present another disadvantage.

As shown in FIG. 2, presently known devices for measuring overlay comprise a mask plate 21 and a wafer plate 22. The mask plate 21 comprises one or more grating patterns that via projection optics 25 are projected on the wafer plate 22. As an example shown in FIG. 2 are a pattern 24 for obtaining overlay information in the Y (scanning direction) and a pattern 26 for obtaining overlay information in the X direction, however other patterns for obtaining overlay information in other directions are possible. The projection optics 25 may have an effect (e.g. demagnification) on the dimensions of the projected patterns 24 and 26. However, to simplify the discussion below, the magnification of the projection optics 25 is assumed to be one, i.e. the dimensions of the pattern on the grating mask are not affected.

On the wafer plate 22, a pattern 27 and a pattern 31 are present. The patterns 24 and 27 (respectively, 26 and 31) are the same. The mask plate 21 is scanned by a slit 23 shaped in the form of an arc. The projection of the slit 23 on the wafer plate 22 is indicated by 29. Between the gratings 24 and 26 on the mask plate 21 (and the corresponding gratings 27 and 31 on the wafer plate), an unpatterned area 28 (indicated by 33 on the wafer plate) is present. The wafer plate 22 is viewed by viewing optics 35 which serve to project an image 37 of the wafer plate 22 onto an array of photodiodes 39.

Such a device may function in the following way. On the wafer plate 22, patterns 27 and 31 are fabricated (for instance, by means of suitable lithographic techniques as will present themselves readily to the skilled person). The wafer plate 22 is then loaded in a lithographic apparatus.

The mask plate 21 with corresponding (e.g. equal) patterns 24 and 26 is also loaded in the lithographic apparatus. The slit 23 which is created by an illumination system in the lithographic apparatus illuminates the patterns 24 and 26 on the mask plate 21. The resulting image is projected via the projection optics 25 on the patterns 27 and 31 of the wafer plate 22. The combination of the projection of pattern 21 on the pattern 27 will result in Moire fringes if an offset (preferably in a rotational direction) is present between the mask pattern and the wafer pattern. The same holds for the projection of the pattern 26 on the pattern 31.

The Moire fringes are captured by the viewing optics 35 and imaged on the array of photodiodes 39. Small differences in the relative orientation of two corresponding patterns relative to each other ("overlay error") may result in a substantial change in the Moire pattern as detected by the photodiodes 39.

In order to measure accurately, it may be desirable or necessary for the slit and the plates not to move relative to each other during measurement. As remarked earlier, an unpatterned area 28, 33 is present on the plates 21, 22. This area may be required e.g. in order to avoid disturbance of the Moire pattern. The fact that the slit 23 is arcuate may cause this unpatterned area to be relatively large. A disadvantage is that for this area, it may not be practical or possible to obtain any overlay information. It may also not be practical or possible, by use of the previously described techniques, to measure overlay in different directions directly next to each other (i.e. without an unpatterned area in between). At least some embodiments of the invention as disclosed herein may be applied as to resolve one or more such problems.

Figure 3:
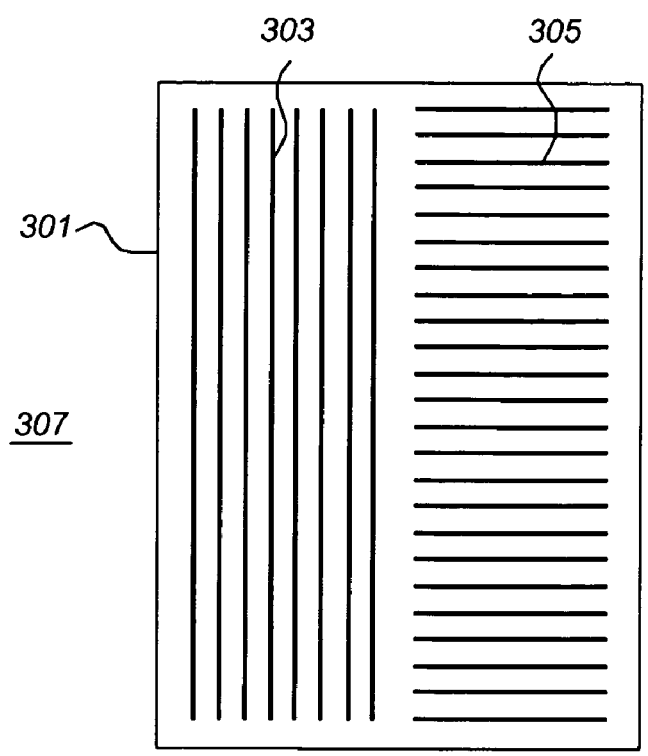
FIG. 3 shows an example of a die pattern according to an embodiment of the invention.

FIG. 3 shows a die area 301 on a wafer 307. The die area 301 comprises two patterns indicated with reference numeral 303 and 305. The patterns 303 and 305 may be produced in the following way. First, the resist-covered wafer 307 is loaded into a lithographic machine and exposures are made of the patterns 303, 305. The patterns 303 and 305 are ruler-like in shape. The patterns may be generated in a lithographic apparatus by exposing corresponding patterns on the reticle ("reticle pattern") with an illumination source. In the following the term "reticle" is used, whereas earlier the term "mask" is used. These are, however, equivalent terms.

The patterns 303 and 305 consist of horizontal and vertical lines and spaces. These lines and spaces correspond to intermittent light-transmitting and light-blocking lines on the exposing pattern. Note that the size of the lines in FIG. 3 is completely out of scale, and that a cross-section of a line has a size comparable to the wavelength of the exposure light (on wafer level). For example, in a 248 nm lithographic apparatus, a line cross-section could be, for example, 1×, 2× or 4× the wavelength of 248 nm (on wafer level). The reticle pattern may then be 4× as large (e.g. due to the lens magnification). As pointed out when discussing the prior art, in the following, it is assumed as well that the dimensions of the reticle pattern are not affected by characteristics of a lens.

A method according to an embodiment of the invention may be applied after aligning the wafer to the reticle in a conventional way. Such alignment may ensure that a relative position between the reticle pattern and the wafer pattern is small, and hence that the overlay measurement system may only need to work in a limited range. Thus, no large capture range may be required and therefore the line width can be so small. The actual number of lines on the 26×32 mm die area is therefore extremely much larger than indicated in FIG. 3. The details of the pattern and particularly the line sizes are discussed in more detail elsewhere herein.

After the wafer 307 is covered with dies like that of die 301 shown in FIG. 3, it is removed from the machine, developed, and possibly etched. The process is chosen such that after these steps, a pattern is formed on the wafer 307 that has a depth which is related to the wavelength of the exposure light, for example having a depth of $\lambda/4$ ($\lambda$ being the wavelength of the light). Hence, the pattern on the wafer does not consist of intermittently reflecting and non-reflecting lines, but rather it may consist of lines with a height difference only.

Figure 4:
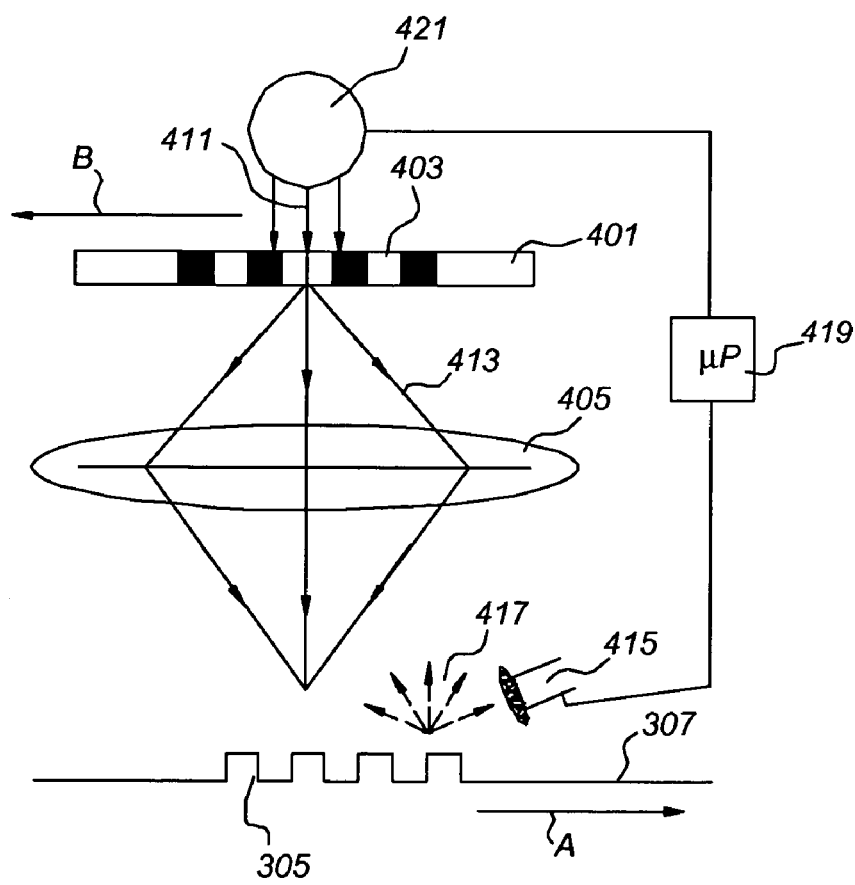
FIG. 4 is a sketch of an arrangement that may be used in applying an embodiment of the invention.

The developed or etched wafer 307 is again loaded into the lithographic apparatus. The device used is schematically depicted with only a few selected components in FIG. 4. In FIG. 4, a reticle 401 with a reticle pattern 403 is shown. The reticle 401 is positioned above a projection lens 405, and on the other side of (e.g. below) the projection lens 405, the wafer 307 shown in FIG. 3 is present. The wafer 307 is viewed from aside such that only the grating pattern 305 shown in FIG. 3 and produced previously on the wafer 307 can be seen.

The reticle pattern 403 is illuminated by exposure light 411 from a source 421. The exposure light 411 is diffracted in diffraction orders 413 upon passing the reticle pattern 403. After the exposure light with the reticle pattern impinges on the grating pattern 305 of the wafer 307, an interference pattern 417 results. A photo detector 415 is present to detect the interference pattern 417. Note that in this example, no undeveloped resist layer is formed on the wafer 307 this time.

Such a device may function in the following way. The same pattern that was exposed previously on the wafer 307 is again exposed onto the wafer 307. This may be done using a normal exposure operation, e.g. with the wafer 307 and reticle 401 making a scanning movement in the direction of the arrows A and B respectively, through an illumination slit (not shown in FIG. 4). In a case where no undeveloped resist is present on the wafer 307, this exposure does not lead to (chemical) changes in a surface of the wafer 307. However, the image of the reticle pattern 403 that is formed on the wafer 307 may interfere with the grating pattern 305 already present on the wafer 307. This interference can be captured by the photo detector 415. The projection may take place while the first pattern and the second pattern perform a scanning motion through an illuminating slit, such that the projection of the second pattern on the first pattern remains in nominally the same position.

So during the exposure of the reticle pattern 403 on the wafer 307, the photo detector 415 may be arranged to sense changes in the amplitude of one or more of the diffraction orders of the diffraction pattern 417. Exposing the pattern 403 on the wafer 307 may be done using the normal exposure speed (depending on the system, this speed may be on the order of 250-500 mm/s). With a speed of 250 mm/s, this arrangement may imply that exposing one die with a length of 32 mm takes about 128 msec (the actual time may be longer due e.g. to overscan, effectively requiring a scan length of 32 mm+ the slit length). Assuming the light source 421 is an 1 kHz type exposure laser, this example may imply that 128 laser pulses are fired to expose the die, which may allow a total of 128 measurement points in Y (scanning) direction within the die.

In an embodiment of the invention, the exposure light 411 is generated by a laser that fires pulses at a specific rate (i.e. the light source 421 is not continuous). In this case, it may be advantageous if the readings of the photo detector 415 are synchronized with the laser pulses. To this end, a microprocessor unit 419 may be coupled to both the source 421 and the photo detector 415.

The reading of the photo detector 415 may provide a direct measure of the overlay error. Hence, synchronization with the actual (wafer and reticle) stage positions as measured by e.g. an interferometer may not be required.

However, it is generally desired to know the contribution of stage errors to the measured overlay. Therefore, a further embodiment of the invention includes measuring stage position data (e.g. interferometer data) synchronously alongside the overlay error. Such interferometer data may be supplied by an interferometer (e.g. position sensor IF, as shown in FIG. 1).

Figure 5:
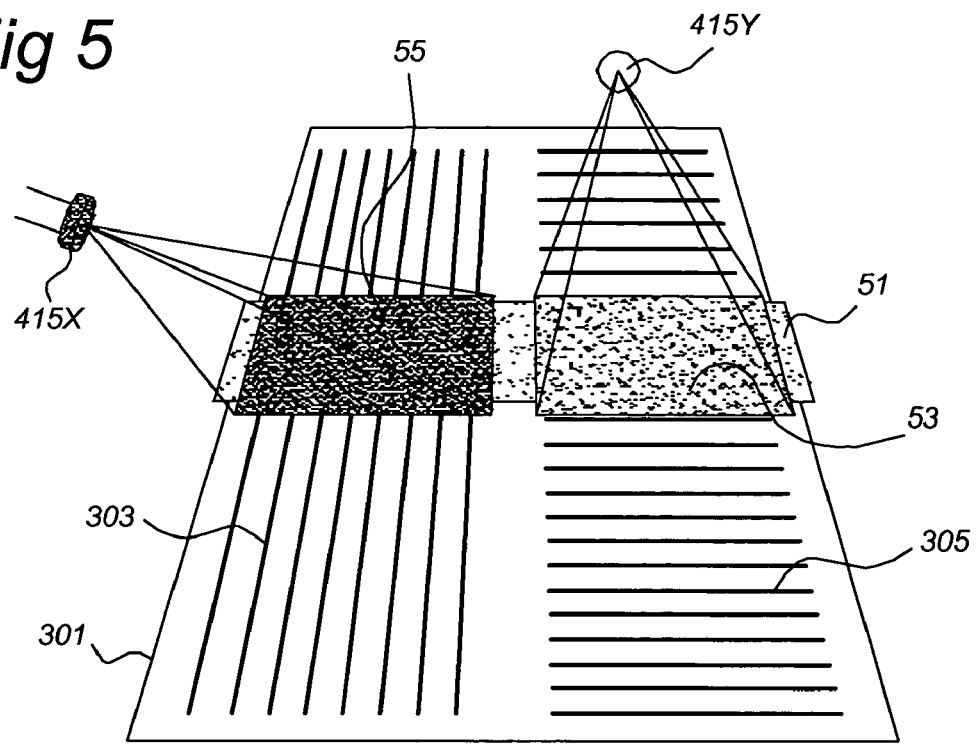
FIG. 5 shows a layout of photo detectors as may be used in an embodiment of the invention.

FIG. 5 shows an example of how overlay information may be obtained in more than one direction. A photo detector 415X and a photo detector 415Y are placed in both the X and Y position respectively, to observe the two patterns 303 and 305 shown in FIG. 3. An illuminated area 51 ("slit") projects patterned exposure light on the patterns 303, 305 of the die 301. Reference numerals 55 and 53 refer to the areas on the die 301 where the interference patterns are generated.

It may be desired that each sensor 415X, 415Y observes the areas 55 and 53 of the gratings 303 and 305 that are completely located in the slit 51. This is shown in FIG. 5. One reason for such an arrangement is that the absolute position of the lines in the illuminated areas 55 and 53 may vary from laser pulse to laser pulse, e.g. due to the scanning motion of the die 301.

It may be desirable for the output of the photo detector 415X and 415Y to be independent of the actual position of the gratings 303, 305 in the illuminated area 51 (e.g. instead it should only be dependent on the relative position of the wafer grating with respect to the projected reticle pattern). Hence, it may be desirable for the detectors 415X and 415Y to integrate the amplitude over the complete grating area in the slit 51. FIG. 5 also shows schematically where the photo detectors 415X and 415Y are placed in the lithographic apparatus with respect to the wafer gratings 303, 305.

The die layout of FIG. 5 may allow only a limited number of overlay measurements in the field. In particular, the left part of the die may be used to measure overlay in X direction, and the right part may be used to measure overlay in Y direction. Therefore, it may be possible that both X and Y overlay can only be measured in one X position in the field. Of course, in Y direction these can be measured at a large number of positions (depending e.g. on scan speed and laser pulse frequency).

Figure 6:
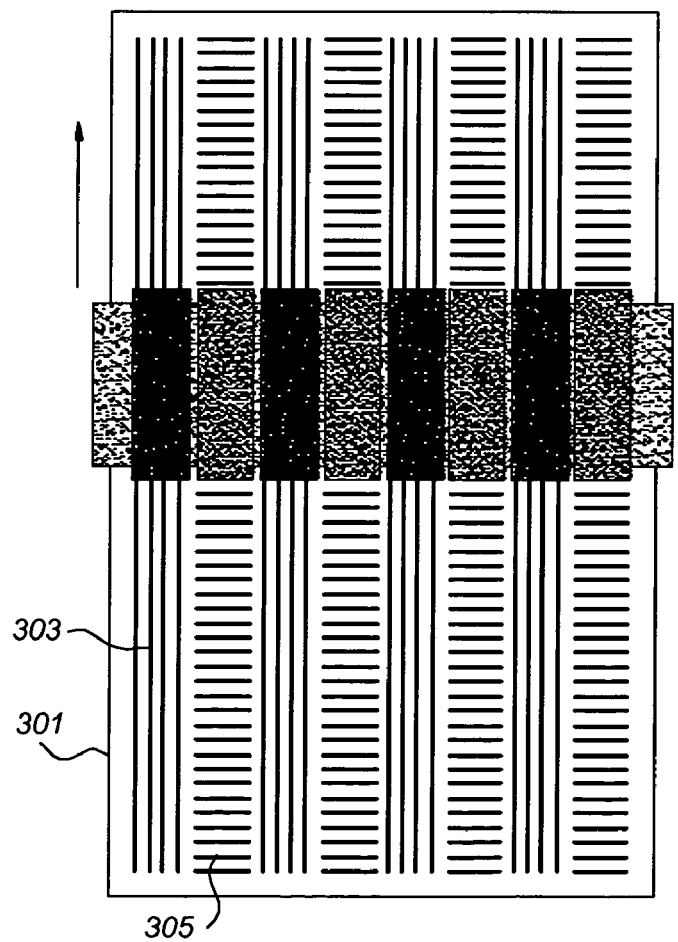
FIG. 6 shows an alternative die layout that may be used in at least some cases to enable more overlay measurements.

To allow overlay measurements in more X positions, the die layout can be altered to cover more gratings. One such example is shown in FIG. 6. In this figure, 8 photo detectors are present: 4 measuring overlay in X direction, 4 measuring overlay in Y direction. Note that although the width of the gratings 303, 305 decreases, the number of lines is still large. For example, using 248 nm exposure radiation, and a line/spacing width of 4× the wavelength of the light, still about 3000 lines are present in each of the (in this case, 8) measurement areas. This number may be large enough to produce the desired or required interference pattern.

In the following, it is explained how the exposed reticle pattern 403 may interfere with the already present pattern 305 on the die 301. The pattern 301 is also referred to as "wafer grating." Below, reference is made to the FIGS. 7 to 11.

If no reticle pattern is present at all and the wafer grating is illuminated by a flat wave front, the wafer grating may still produce a diffraction pattern. The exact pattern that is produced may depend on the type of grating on the wafer. For example, if the wafer grating is a phase grating, having a depth of $\lambda/4$, the zeroth order reflection may be absent. However, if the wafer grating consists of intermittently reflective and non-reflective lines (light/dark grating or "amplitude grating"), the zeroth order reflection may be present.

Figure 7:
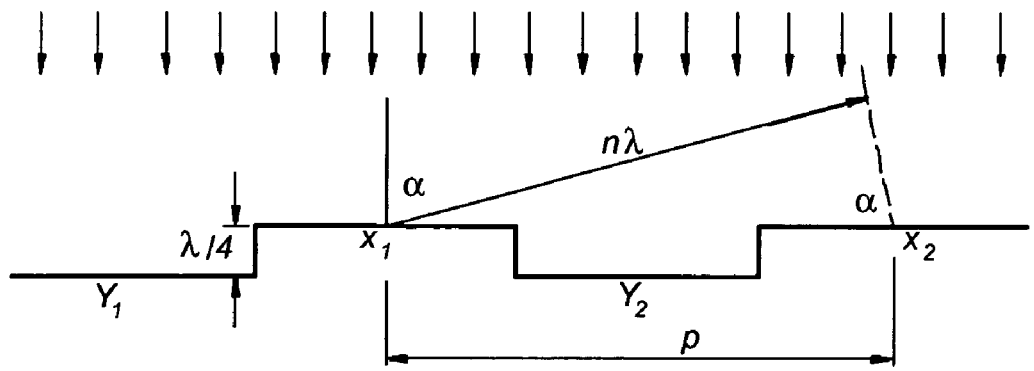
FIGS. 7-11 are sketches that describe aspects of an application of an embodiment of the invention.

In essence, if light (either a continuous beam or a patterned beam) reaches the wafer grating from above, interference orders may reflect off the wafer at an angle $\alpha$ (see FIG. 7). The angle $\alpha$ may be independent of factors other than the pitch p of the grating and the wavelength $\lambda$ of the incoming light. In FIG. 7, light reflected off point $X_1$ interferes with light reflected off point $X_2$, and so on. The angle $\alpha$ is such that waves reflected from points $X_1$ and $X_2$ have the same phase, i.e. the path difference from these points in the direction of the reflected beam is an integer number n times the wavelength $\lambda$. From FIG. 7, it then easily follows:

$$\sin(\alpha) = \frac{n\lambda}{p}$$

This is the general grating formula that relates $\alpha$ to p and $\lambda$. The grating of FIG. 7 is a so-called "phase grating". This means that light from points $Y_1$ and $Y_2$ while interfering, produces similar diffraction beams as light from $X_1$ and $X_2$. A phase grating has the same angles of reflection as a light/dark grating. However, the two beams (one from $X_1$ and $X_2$, one from $Y_1$ and $Y_2$) have a mutually different phase. Depending on the diffraction order, the grating pitch p, and so on, it is possible that these two beams (at least partially) cancel each other due to the phase difference between the beams. Hence, although the reflection angles are the same in a phase grating and a light/dark grating, the amplitude of the resulting light beams may be different.

A striking example of this difference is the zeroth order beam. In a light/dark grating, this beam has a high amplitude. However, in a phase grating, the beam from $Y_1$ and $Y_2$ travels $\lambda/2$ farther than the beam from $X_1$ and $X_2$, hence canceling this beam completely, such that a zero amplitude remains.

FIG. 7 shows what happens when the wafer grating is illuminated while no reticle pattern is present. If, by contrast, a light/dark pattern is present on the reticle, the illumination of the wafer grating may change depending on how the reticle pattern is situated. If the reticle changes from a first position to a second position, different parts of the wafer grating may be illuminated. Two basic examples for such positions are shown in FIGS. 8a, 8b.

In the top plot (FIG. 8a), light is striking the grating only at the 'tops' of the wafer grating. The interference that now occurs is only defined by the light emitted from $X_1$, $X_2$ and so on. The result resembles an interference pattern created by a light/dark grating instead of a phase grating (the non-illuminated bottoms have the same effect as a dark part in the grating). The same happens when the illuminating light only strikes the bottoms of the grating (FIG. 8b). Now, $Y_1$ and $Y_2$ interfere with each other, creating a similar interference pattern as in FIG. 8a, again resembling a light/dark grating.

Figure 8A:
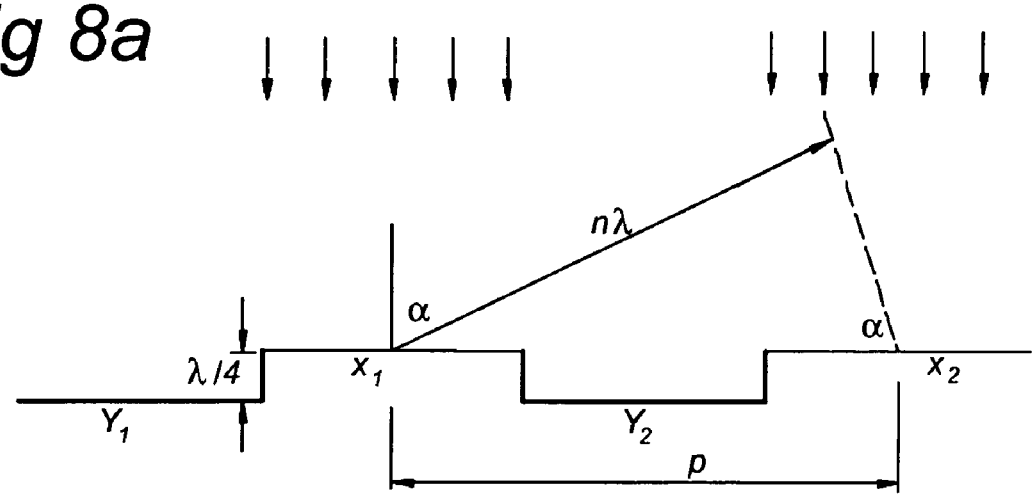
Figure 8B:
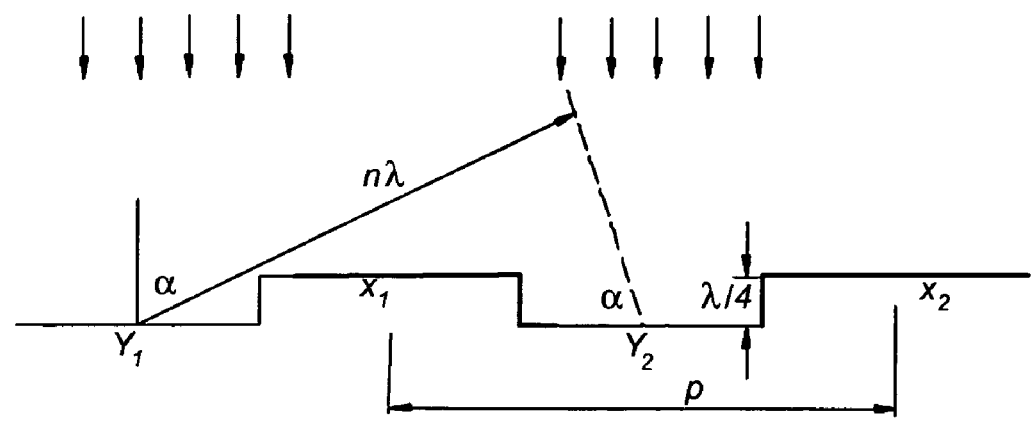
Figure 9:
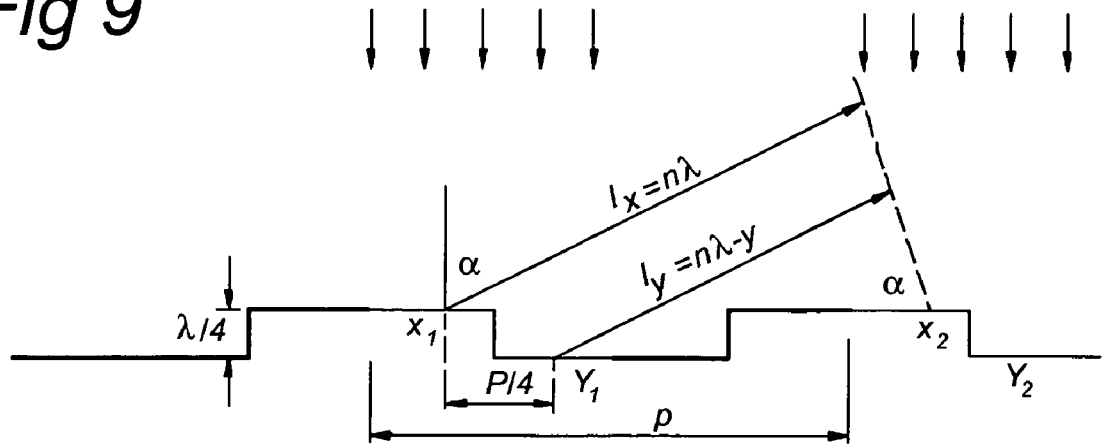

FIG. 9 shows the situation where the illumination light has shifted to the right one quarter of the period p as compared to FIG. 8a. Now, partly the top is illuminated, while also partly the bottom is illuminated. The distance between the centres of gravity of the $X_1/X_2$ beam and of the $Y_1/Y_2$ beam equals p/4. The points $X_1$ and $X_2$ interfere with each other, creating an interference beam as shown in FIG. 8a. Similarly, the points $Y_1$ and $Y_2$ interfere with each other, creating an interference beam having the same diffraction angle α. Now, the $X_1/X_2$ interference beam has a different travel length than the $Y_1/Y_2$ interference beam. In addition, the light has already traveled λ/4 further before reaching the grating bottom, compared to the illumination beam that illuminates the top. The total travel length difference may create amplification or reduction of the resulting total beam amplitude.

Figure 10:
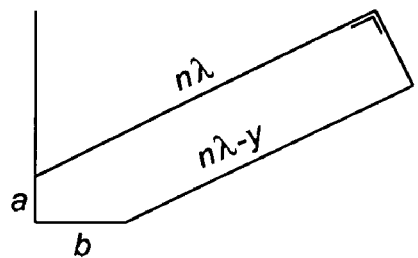

The travel length of the beam reflected off $Y_1/Y_2$ can be found by calculating the properties of the geometrical figure in FIG. 10. It can be found that the beam length from $Y_1/Y_2$ is smaller than the beam length from $X_1/X_2$ by an amount of:

$$y = b \sin(\alpha) - a \cos(\alpha)$$

Taking into account the extra length of λ/4 the illumination light has to travel towards $Y_1/Y_2$, the $Y_1/Y_2$ beam length is shorter than the $X_1/X_2$ beam length (FIG. 9) by the amount of:

$$l_x - l_y = -\frac{\lambda}{4} + \left(\frac{p}{4}\sin(\alpha) - \frac{\lambda}{4}\cos(\alpha)\right)$$

Figure 11:
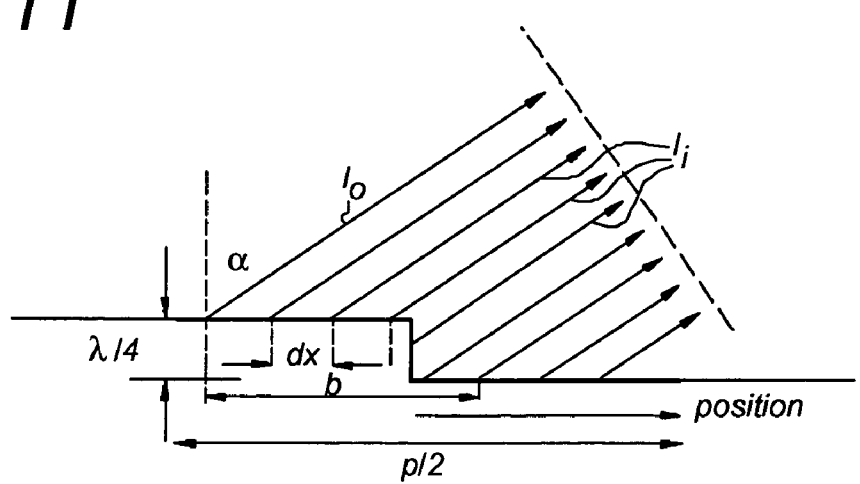

To be more exact, of course, an infinite number of 'beams' may irradiate from the bottom and top parts of the grating. It may not be sufficient to consider only one x beam and one y beam, each radiating from the centre of gravity of the illuminated bottom and top parts. More of these beams are illustrated in FIG. 11. It may be desirable to perform actual calculation of the amplitude of each of the diffraction orders by considering a large (preferably infinite) number of beams, each of which has a small phase shift with respect to the other beams, also depending on whether the beam is emitted from the top or the bottom of the grating.

Compared to the leftmost beam in FIG. 11, each beam emitting from the top of the grating has a beam length difference of:

$$l_i - l_0 = b \sin(\alpha)$$

Here, b is the distance of the beam with respect to the leftmost beam, $l_i$ denotes the length of the i-th beam, and $l_0$ denotes the length of the leftmost beam. Beams emitted from the bottom of the grating have a length difference of:

$$l_i - l_0 = -\frac{\lambda}{4} + \left(b\sin(\alpha) - \frac{\lambda}{4}\cos(\alpha)\right)$$

The total resulting beam consists of the summation of all the sub-beams as described above, each having the same amplitude, and having a phase difference with respect to the leftmost beam of:

$$\phi_i = 2\pi \frac{l_i - l_0}{\lambda}$$

The reflected light wave can then be described by:

$$I(t) = \frac{1}{k}\sum_{i=0}^{k} \sin(\omega t + \phi_i),$$

with $$\omega = 2\pi \frac{c}{\lambda}$$

Here, c is the speed of light, k is the total number of beams, and the total amplitude is normalised to 1. This can be rewritten as a new sinusoid with a phase φ' instead of φ:

$$I(t) = A \sin(\omega t + \phi')$$

with φ' incorporating the contribution of the individual φ's in the formula above. The amplitude A may then be taken to represent the effective amplitude of the resulting beam. Finding an expression for A is not easy, but A can be found experimentally by adding all sinusoids and determining the maximum amplitude (e.g. using a Matlab script or other automatic calculation).

Alternatively, the number of beams can be set to infinity, which changes the summation of sinusoids into an integral form. Assume the leftmost beam in FIG. 11 emits from a position x=0. A beam emitting from the top of the grating, from a distance x from the leftmost beam, then has a travel path difference of:

$$\Delta l = x \sin(\alpha)$$

and hence has a phase shift of:

$$\phi(x) = \frac{2\pi}{\lambda}\Delta l = \frac{2\pi}{\lambda}x\sin(\alpha)$$

Now, assume the illuminated part on the top has a length of $x_P$, then the complete beam emitted from the top can be described by:

$$I_1(t) = \left(\frac{2}{p}\right)\int_{x=0}^{x_P} \sin\left(\omega t + \frac{2\pi}{\lambda}x\sin(\alpha)\right)dx$$

Here, the factor (2/p) normalizes the beam to an incoming amplitude of 1: the division by p is applied because the integral only covers one period in the grating, the factor 2 is applied because only ½ of the grating is illuminated. Evaluating the above equation yields:

$$I_1(t) = \frac{\lambda}{p\pi\sin(\alpha)}\left(\cos(\omega t) - \cos\left(\omega t + \frac{2\pi}{\lambda}x_P\sin(\alpha)\right)\right)$$

Similarly, a beam reflected off the bottom of the grating has a travel path difference of:

$$\Delta l = x\sin(\alpha) - \frac{\lambda}{4}(1 + \cos(\alpha))$$

Which in turn leads to a phase difference of $$\phi(x) = \frac{2\pi}{\lambda}\Delta l$$

-continued $$= \frac{2\pi}{\lambda}\left(x\sin(\alpha) - \frac{\lambda}{4}(1+\cos(\alpha))\right)$$

$$= \frac{2\pi}{\lambda}x\sin(\alpha) - \frac{\pi}{2}(1+\cos(\alpha))$$

Now, the beam emitted from the bottom of the grating can be described by:

$$I_2(t) = \left(\frac{2}{p}\right)\int_{x=x_P}^{\frac{p}{2}} \sin\left(\omega t + \frac{2\pi}{\lambda}x\sin(\alpha) - \frac{\pi}{2}(1+\cos(\alpha))\right)dx$$

which similarly results in:

$$I_2(t) = \frac{\lambda}{p\pi\sin(\alpha)}\left(\cos\left(\omega t + \frac{2\pi}{\lambda}x_P\sin(\alpha) - \frac{\pi}{2}(1+\cos(\alpha))\right) - \cos\left(\omega t + \frac{2\pi}{\lambda}\frac{p}{2}\sin(\alpha) - \frac{\pi}{2}(1+\cos(\alpha))\right)\right)$$

The description of the total beam now equals $$I(t) = I_1(t) + I_2(t),$$

which can be calculated to be:

$$I(t) = \frac{2\lambda}{p\pi\sin(\alpha)}\left[\sin\left(\frac{\pi}{\lambda}x_P\sin(\alpha)\right)\sin\left(\omega t + \frac{\pi}{\lambda}+x_P\sin(\alpha)\right) + \sin\left(\frac{\pi}{\lambda}\left(\frac{p}{2}-x_P\right)\sin(\alpha) - \frac{\pi}{2}(1+\cos(\alpha))\right)\right]$$

The amplitude of I(t) equals:

$$A = \frac{A_x(A_x + A_y\cos(\beta))}{\sqrt{A_x^2 + A_y^2 + 2A_xA_y\cos(\beta)}} + A_y\sin\left(\arctan\left(\frac{A_x + A_y\cos(\beta)}{A_y\sin(\beta)}\right) + \beta\right)$$

With:

$$A_x = \frac{2\lambda}{p\pi\sin(\alpha)}\sin\left(\frac{\pi}{\lambda}x_P\sin(\alpha)\right)$$

$$A_y = \frac{2\lambda}{p\pi\sin(\alpha)}\sin\left(\frac{\pi}{\lambda}\left(\frac{p}{2}-x_P\right)\sin(\alpha)\right)$$

$$\beta = \frac{\pi}{2}\left(\frac{p}{\lambda}\sin(\alpha) - (1+\cos(\alpha))\right)$$

This formula gives the amplitude of the resulting beam reflected off the grating for each of the angles α defined by the grating formula. It may appear that the diffraction order n has vanished from this equation, but in fact it is included via the path length difference which includes the angle α and the grating pitch p. Of course, the angle α is linked to the diffraction order by $$\sin(\alpha) = \frac{n\lambda}{p}.$$

Now, when the incident light beam changes from the position shown in FIG. 8a (the light is incident on the "tops") to the position shown in FIG. 8b (the light is incident on the "bottoms"), the amplitude of the diffracted beams may vary because in the above equations, $x_P$ changes from (p/2) to 0. This change may translate into a net resulting light amplitude according to the above equation for the total amplitude A.

Figure 12:
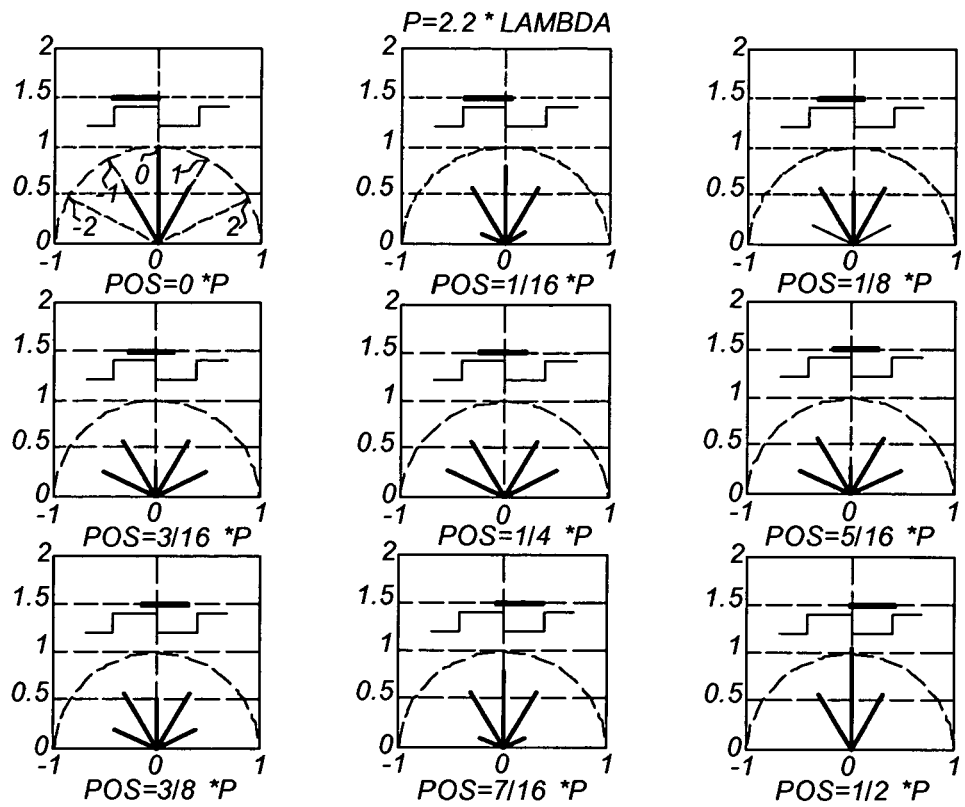
FIGS. 12 and 13 show calculated results on the basis of previously derived formulas.
Figure 13:
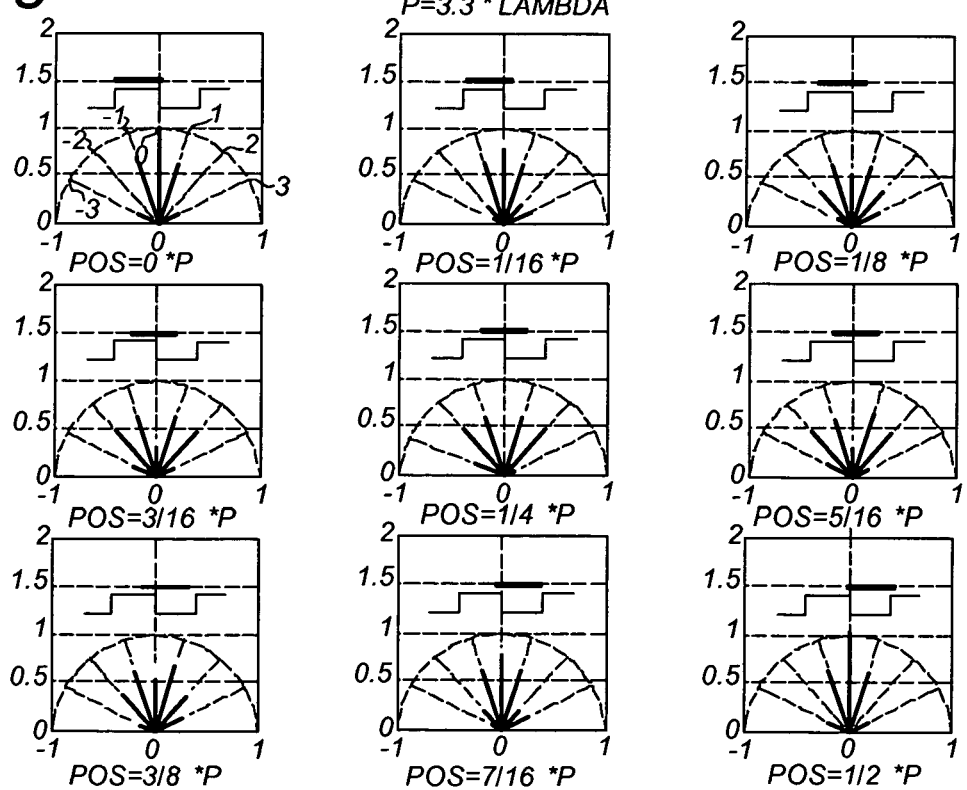

FIGS. 12 and 13 show examples of diffracted beams emitted from the grating, which is positioned at position (0,0). The diffraction orders are shown for a varying position of the illuminating beam. In the top left plot, the tops are illuminated, going on to the bottom right plot where the bottoms are illuminated. The grating pitch in this example equals p=2.2λ.

The length of each line in FIG. 12 indicates the amplitude of the diffraction order. The orders ( . . . , −1, 0, 1, . . . ) of the beams and their respective positions have been indicated in the first graph of FIG. 12. For the other graphs these are also shown.

It can be seen that the 0th order beam in the first (top left) and last (bottom right) positions is present at maximum amplitude. However, when the illuminating beam travels, the 0th order beam decreases in amplitude, to vanish completely at a position of p/4. In that case, the grating behaves completely like a phase grating. Further, note that the 2nd order beam is not present in the first and last positions, but appears in between. This result is a manifestation of a well-known phenomenon: the diffraction pattern of a light-dark grating resembles a Fourier series of a block wave, in which only the uneven terms are non-zero. Apparently, the 2nd order reappears in a phase grating.

Note also that the +1st and −1st order beams, reflected to the right and to the left, do not have an exactly equal amplitude. This result is related to the depth of the grating of λ/4, causing the travel path difference for the left and right 1st-order beam to be unequal. Note further that the modulation (position dependency) of the 1st order is relatively small.

Another example is given in FIG. 13, where p=3.3λ. This includes a 3rd reflection order at a respective position in the graphs.

Figure 14:
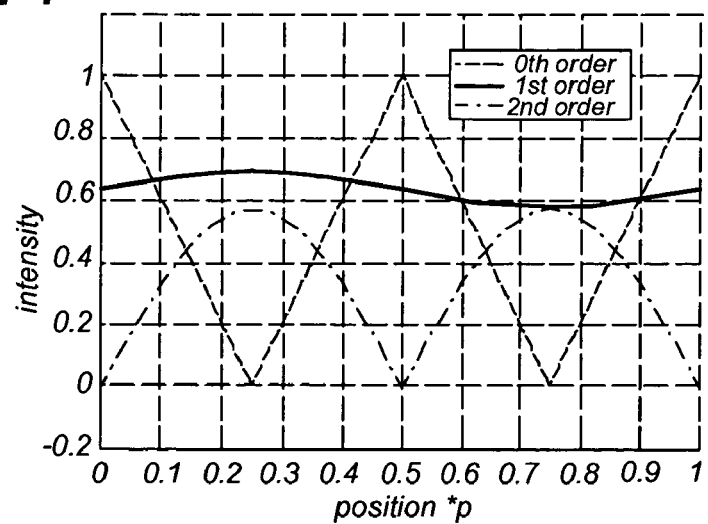
FIGS. 14, 15 and 16 show reflected beam amplitude for various orders as a function of position, for different grating pitches.

FIG. 14 shows the beam amplitude of the 0th through the 2nd order as a function of position, for a grating pitch of 2.2λ. Here also, a position '0' indicates illumination light only on the tops of the grating. It is observed that (apart from the 0th order, which may not easily be measured because e.g. such measurement may require a sensor to be placed in the illumination path), the 2nd order has the best modulation depth. It can also be seen that the 1st order is not completely independent of the position; it has a modulation of about 17%. Still, this makes it possible to use a measurement of the amplitude of the 1st order as a reference value.

If the 2nd order grating would be used for relative position measurement, a nominal position would be chosen at a place where the slope of the curve is large, e.g. at a position of 0.1 or 0.4 times the grating pitch p. Such selection may ensure a high sensitivity of the photo detector output as a function of position. Such a choice may also mean that the reticle pattern is not exposed at exactly the same location as in the first exposure pass, but with a slight offset in both X and Y directions. The maximum useable range would then be about +/−0.1p. In this example with p=2.2λ, this amounts to a range of +/−50 nm if λ=248 nm. Because the overlay error that is to be measured is usually substantially smaller than 50 nm, no large capture range may be required and a +/−50 nm range may suffice nicely.

Figure 15:
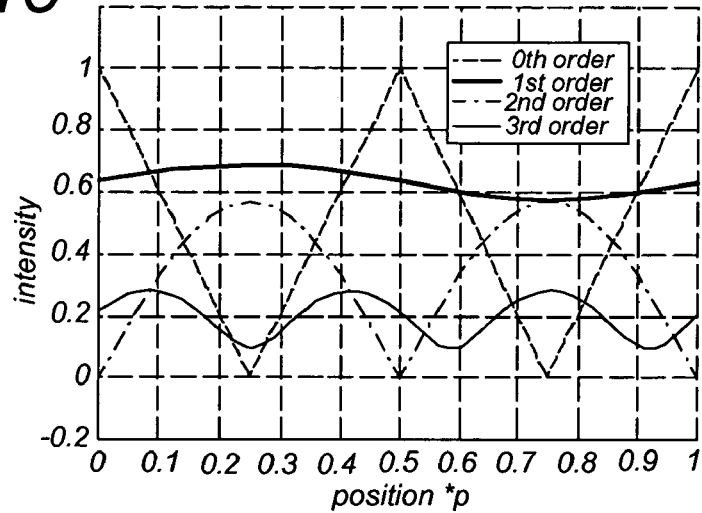

FIG. 15 shows a similar plot for p=3.3λ. It can be seen that the 3rd order has a higher periodic frequency than the lower orders. Remember that the horizontal axis is related to p, so the absolute displacement in FIG. 14 is 1.5× larger than in FIG. 15.

It appears to be a general phenomenon that the even orders show a large modulation depth, while the uneven orders show a much smaller modulation depth. This effect can be exploited, because a reflected beam having a small sensitivity for position variations can be used as a reference beam. Because such a beam may depend on dose variations in the illuminating light, on wafer reflectivity variations, and on other disturbing factors, changes in its amplitude could be used to correct the actual measurement beam (e.g. the 2nd order). Such a technique may be especially useful in an on-the-fly measurement scheme, because principally a zero overlay error may result in a constant measured beam amplitude. Any deviation in the measured amplitude may then be interpreted as a position change (overlay error). The availability of a beam that is independent of the relative position, but can act as a measure for any disturbances, may therefore help in creating an accurate measurement of the relative position.

Now, as seen for example in FIGS. 14 and 15, the sensitivity of the 1st order is not exactly zero. To facilitate use of the 1st order as reference beam, the +1 and −1 beams could be measured simultaneously and averaged, yielding a zero sensitivity. This is possible because the 1st order beam reflects differently in positive and negative direction.

Alternatively, it is possible to change the grating depth slightly to minimize the modulation of the 1st order. It appears that the sensitivity of the 1st order is zero if the grating depth d equals:

$$d = \frac{2}{1 + \sqrt{1 - \lambda^2/p^2}} \cdot \frac{\lambda}{4}$$

For example, if the grating pitch p equals 2.2λ, a choice $$d = 1.0578 \cdot \lambda/4$$

Figure 16:
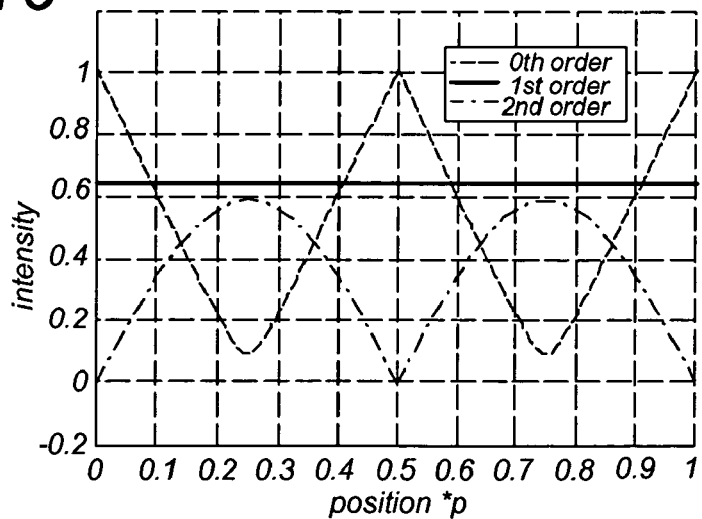

(instead of the previously used λ/4) leads to a sensitivity of the 1st order of 0, as shown in FIG. 16. Hence, the grating depth can be optimized for a zero sensitivity of the 1st order, e.g. to facilitate use of this order as a reference beam. Note that the other diffraction orders do not change significantly.

Which of the two methods is used (either measuring the +1 and −1 order beams and averaging, or creating an insensitive 1st order by optimizing the grating depth) may depend, amongst other factors, on the possibility to manufacture a grating with such an accurate grating depth.

In order to make the amplitude sensitive to the mentioned relative position, it may be desirable or necessary to apply a slight shift to the exposure position in X and Y direction.

Some orders are substantially independent on the relative position, while others are very much dependent. An amplitude of one or more of the position-independent diffraction orders can be sensed by a photo detector, in addition to an amplitude of one or more of the position-dependent orders. The output of the photo detector that senses the position-dependent order (in the example in the previous chapter, this was the 2nd order) can be corrected by the amplitude measured by the photo detector sensing the position-independent diffraction order (in the example, this was the 1st order). In such manner, the method can be made insensitive to variations in illumination dose, wafer reflectivity, and so on. The two photo detectors used could either be placed on the same side of the wafer grating (i.e. measuring the +1st and +2nd orders), or on opposite sides of the grating (i.e. measuring the +1st and −2nd orders), depending on available space in the machine. It could also be decided to measure both the +1 and −1, and +2 and −2 orders, e.g. to create a more accurate measurement signal.

During the exposure of the reticle pattern onto the wafer, both the wafer and the reticle are scanning at full speed through the illumination slit. However, the projection of the reticle pattern on the wafer may be standing still with respect to the wafer grating. Hence, if the overlay error is zero, the reticle pattern is projected on exactly the same relative position on the wafer at all times. Then, the photo detector output is constant. This aspect is a difference as compared with usual alignment methods, in which the wafer grating is scanned purposely relative to the reticle pattern, to create an amplitude reading as a function of position.

Due to deviations in a practical system as compared to ideal calculations as discussed in previous paragraphs, it may be desirable or necessary to calibrate the actual dependence of the photo detector outputs as a function of relative position (e.g. the curve in FIG. 14 or FIG. 16 that is used for position sensing). Such calibration can easily be done by scanning the wafer grating over one or more periods p with low speed, while simultaneously measuring the wafer stage and reticle stage interferometer positions. The curves in FIG. 14 can then be actually measured and for example be stored in a table, e.g. to be used to translate photo detector outputs to actual relative positions in the actual overlay measurement.

It may not be practical or possible to perform actual overlay measurements at every position in the field. In the scanning (Y) direction, the number of points where an overlay measurement can be performed may be limited only by the scan speed and the laser pulse frequency. In the non-scanning (X) direction, each position where an overlay measurement is desired may need a grating. For example, in the die layout of FIG. 6, eight gratings are present: 4 X-gratings and 4 Y-gratings. Hence, overlay in the X direction can be measured in 4 X-locations, and overlay in Y-direction can also be measured at 4 X-locations.

To increase the position accuracy of the overlay measurement, it is possible to average a number of samples to create one measurement value. This operation may decrease the number of measurements in a complete field. Another possibility is to perform the measurement process twice, at slightly different locations of the reticle grating with respect to the wafer grating. In such manner, it may also be possible to improve sensitivity to some disturbing factors, e.g. dose variations.

Each X-location where an overlay measurement is to be performed may need one or more photo detectors (e.g. when the 1st and 2nd order are measured, two photo detectors are required per X-position). It may be desirable or necessary to place the photo detectors observing one of the X-gratings (vertical lines in FIG. 6) in the X-direction with regard to the illumination position, e.g. to be able to capture the diffraction beams. Similarly, it may be desirable or necessary to place the photo detectors observing the Y-gratings in the Y-direction with regard to the illumination position. So, in the case of the layout in FIG. 6, and using two photo detectors per order, the total number of photo detectors may amount to eight gratings×2 detectors=16 detectors, 8 of which measure in X direction and 8 of which measure in Y direction.

Embodiments of the invention have been described by way of example only. Several alternatives can be developed by persons skilled in the art starting from such description. For instance, several parameters could be optimized, such as the grating pitch p, the depth of the wafer grating d (in the examples set at $\lambda/4$), and possibly even the ratio between the size of the top and the bottom in the wafer grating (which are equal in one embodiment).

One example has already been described: optimizing the grating depth for minimum sensitivity of the 1st order e.g. to facilitate use of this order as a reference beam. Also, the reticle pattern could be made to deviate from the original pattern exposed on the wafer, e.g. by choosing an asymmetrical light/dark ratio. Such parameters could be tuned such that the system functions optimally, e.g. the modulation depth of the measurement order is maximal; the modulation depth of the reference order is minimal; the photo detectors can be placed in a favorable location in the machine, and so on. Also, the actual relation between the amplitude of said diffraction order, and the relative displacement of the first pattern and the second pattern, can be calibrated, and said calibration result can be used to improve the accuracy of the measurement.

Another possibility would be that the measurement is repeated at least twice at possibly different relative positions of the first pattern with respect to the second pattern. By repeating the measurement over a complete wafer, which generally will comprise at least one die, it is possible to obtain overlay measurement data over said wafer.

A device according to one embodiment of the invention is arranged to generate a diffraction pattern resulting from interference between a first pattern and a projection of a second pattern, the diffraction pattern comprising at least a diffraction order with an amplitude, and the device further comprises a detector for measuring said amplitude. In at least some application, such a device may be used to enable flexible overlay measurements everywhere on the die/wafer and is very accurate. The projection may take place while the first pattern and the second pattern perform a scanning motion through an illuminating slit such that the projection of the second pattern on the first pattern remains in nominally the same position.

In one embodiment, the first pattern comprises a first longitudinal structure oriented along a first direction and a second longitudinal structure oriented along a second direction. Such an arrangement may make it possible to obtain overlay information in several directions simultaneously.

In a further embodiment, the first longitudinal structure alternates with the second longitudinal structure. Such an arrangement may make it possible to obtain overlay information at several locations of the die/wafer.

In a further embodiment, the detector is a photo detector. These types of detectors may be especially suited to apply particular embodiments of the invention.

In a further embodiment, the detector is operated in synchronism with the projection of the second pattern. It may be advantageous to only operate the detector when a projected pattern is indeed present.

In a further embodiment, the first pattern comprises at least one phase grating, the second pattern being projected on the first pattern with a projection beam having a wavelength $\lambda$, the at least one phase grating having a grating depth of substantially $\lambda/4$. Choosing the depth this way may have the advantage that a maximum modulation depth is obtained.

In a further embodiment, the detector is arranged to measure the amplitude of at least an even diffraction order of the diffraction pattern. This variation may enable a large measurement range. Furthermore, the measurement may be carried out outside the projection of the second pattern, which may result in a minimized disturbance.

In a further embodiment, the detector is arranged to measure the amplitude of the even diffraction order simultaneously with at least one odd diffraction order of the diffraction pattern. One potential advantage of an odd diffraction order is its relatively limited dynamic range. Thus, this odd diffraction order may serve as a reference during the measurement.

In a further embodiment, the first pattern comprises at least one phase grating, the second pattern being projected on the first pattern with a projection beam having a wavelength $\lambda$, the at least one phase grating having a grating depth especially chosen to create a minimum modulation depth of at least one of the diffraction orders. The minimum can advantageously be used to obtain a relatively constant reference. By choosing the modulation depth equal to $1.0578 \lambda/4$, for example, the first order may be substantially constant.

In a further embodiment, the detector is located outside the projection beam. In this way, the detector may advantageously not disturb the projection beam.

In a further embodiment, the measurement is repeated on a wafer, said wafer comprising at least one die. Hereby, overlay measurement data over a wafer may be obtained. This arrangement may enable qualification of the overlay performance of a lithographic machine.

A lithographic apparatus according to an embodiment of the invention includes an illumination system for providing a projection beam of radiation; a support structure for supporting a patterning structure, the patterning structure serving to impart the projection beam with a pattern in its cross-section; a substrate table for holding a substrate; and a projection system for projecting the patterned beam onto a target portion of the substrate.

This lithographic apparatus also includes a device for determining overlay comprising a first module with at least a first pattern and a second module with a second pattern, said second pattern corresponding to said first pattern, the device being arranged to generate a projection by said projection beam of radiation of said second pattern on said first pattern. The device is arranged to generate a diffraction pattern resulting from interference between said first pattern and said projection of said second pattern, said diffraction pattern comprising at least a diffraction order with an amplitude and said device further comprises a detector for measuring said amplitude.

In an embodiment, the lithographic apparatus further comprises at least a meter for measuring a position of at least a stage in said lithographic apparatus, and said amplitude and said position are measured in synchronism. This arrangement has the potential advantage that it is possible from these measurement data to obtain the contribution of stage errors to overlay errors.

A method for determining overlay according to an embodiment of the invention includes providing a first module with at least a first pattern; providing a second module with a second pattern, said second pattern corresponding to said first pattern; generating a projection by a projection beam of radiation of said second pattern on said first pattern; generating a diffraction pattern resulting from interference between said first pattern and said projection of said second pattern, said diffraction pattern comprising at least a diffraction order with an amplitude; and measuring said amplitude.

Whilst specific embodiments of the invention have been described above, it will be appreciated that the invention as claimed may be practiced otherwise than as described. For example, embodiments of the method may also include one or more computers, processors, and/or processing units (e.g. arrays of logic elements) configured to control an apparatus to perform a method as described herein, or a data storage medium (e.g. a magnetic or optical disk or semiconductor memory such as ROM, RAM, or flash RAM) configured to include instructions (e.g. executable by an array of logic elements) describing such a method. It is explicitly noted that the description of these embodiments is not intended to limit the invention as claimed.

The invention claimed is:

1. A measurement device comprising:
a first object having a first pattern;
a second object having a second pattern corresponding to the first pattern;
a projection system configured to project an image of the first pattern onto the second pattern; and
a detector configured to measure an amplitude of at least one order of a diffraction pattern resulting from an interference of the second pattern and the projected image.

2. The measurement device according to claim 1, wherein the second pattern comprises a first longitudinal structure oriented along a first direction and a second longitudinal structure oriented along a second direction.

3. The measurement device according to claim 2, wherein the first longitudinal structure alternates with the second longitudinal structure along at least one of the first and second directions.

4. The measurement device according to claim 1, wherein said detector includes a photo detector.

5. The measurement device according to claim 1, wherein said detector is configured to measure the amplitude in synchronism with an illumination of the first pattern.

6. The measurement device according to claim 1, wherein said detector is configured to measure the amplitude in synchronism with a measurement of a position of at least one of the first pattern and the second pattern.

7. The measurement device according to claim 1, wherein the second pattern includes at least one phase grating, and
wherein the projected image has a wavelength $\lambda$, and
wherein the at least one phase grating has a grating depth of substantially $\lambda/4$.

8. The measurement device according to claim 1, wherein said detector is arranged to measure an amplitude of at least an even diffraction order of the diffraction pattern.

9. The measurement device according to claim 8, wherein said detector is arranged to measure the amplitude of at least an even diffraction order simultaneously with an amplitude of at least one odd diffraction order of the diffraction pattern.

10. The measurement device according to claim 1, wherein the detector is configured to measure an amplitude of more than one diffraction order of the diffraction pattern, and
wherein at least one of the more than one diffraction orders has a low sensitivity to relative position changes of the first pattern with respect to the second pattern as compared to another order of the diffraction pattern.

11. The measurement device according to claim 10, wherein the measurement device is configured to correct a measured amplitude of at least one order of the diffraction pattern based on a measured amplitude of at least one other order of the diffraction pattern.

12. The measurement device according to claim 1, wherein the second pattern includes at least one phase grating, and
wherein the projected image has a wavelength $\lambda$, and
wherein at least one of the diffraction orders of the diffraction pattern is relatively insensitive to modulation with respect to a relative position of the projected image and the second pattern as compared to at least one of the other orders of the diffraction pattern.

13. The measurement device according to claim 12, wherein the second pattern comprises at least one phase grating, and
wherein the projected image has a wavelength $\lambda$, and
wherein at least one among the first pattern and a grating depth of the at least one phase grating is selected to provide the relative insensitivity.

14. The measurement device according to claim 1, wherein said detector is located outside the projected image.

15. The measurement device according to claim 1, wherein the measurement device is configured to calibrate an overlay measurement based on a relation between the measured amplitude and a corresponding relative displacement of the first pattern and the second pattern.

16. The measurement device according to claim 1, wherein the detector is configured to measure the amplitude again at a different relative position of the first pattern with respect to the second pattern.

17. The measurement device according to claim 1, wherein the projection system is further configured to project the first pattern onto a wafer comprising at least one die, and
wherein the detector is further configured to measure an amplitude of the at least one order of a diffraction pattern resulting from an interference of the wafer and the projected image.

18. A lithographic apparatus comprising:
an illumination system configured to provide a beam of radiation;
a support structure configured to support a patterning structure, the patterning structure configured to impart the beam with a pattern in its cross-section;
a substrate table configured to hold a substrate;
a projection system configured to project the patterned beam onto a target portion of the substrate;
a first object having at least a first pattern;
a second object having a second pattern corresponding to said first pattern; and
a detector,
wherein the illumination system is configured to illuminate the first pattern, and
wherein the projection system is configured to project a patterned beam including an image of the first pattern onto the second pattern, and
wherein the detector is configured to measure an amplitude of at least one order of a diffraction pattern resulting from interference between the second pattern and the projected image.

19. The lithographic apparatus according to claim 18, wherein said lithographic apparatus further comprises at least a meter configured to measure a position of at least one among the first object, the second object, and the substrate table, and wherein said detector is configured to measure the amplitude and said meter is configured to measure the position in synchronism with each other.

20. The lithographic apparatus according to claim 18, wherein the lithographic apparatus is configured to calibrate an overlay measurement based on a relation between the measured amplitude and a corresponding relative displacement of the first pattern and the second pattern.

21. A method for measurement, said method comprising:
illuminating a first object having at least a first pattern;
projecting an image of the first pattern onto a second object having a second pattern corresponding to the first pattern; and
measuring an amplitude of at least one order of a diffraction pattern resulting from interference between the second pattern and the projected image.

22. The method according to claim 21, wherein said illuminating includes using a radiation system to provide a beam of radiation.

23. The method according to claim 21, wherein said method further comprises:
using a patterning structure to impart a beam of radiation with a pattern in its cross-section; and
projecting the patterned beam onto a target portion of a layer of radiation-sensitive material that at least partially covers a substrate,
wherein said projecting the patterned beam includes positioning at least one among the patterning structure and the substrate based on the measured amplitude.

24. The method according to claim 21, wherein the second pattern includes at least one phase grating, and
wherein the projected image has a wavelength $\lambda$, and
wherein the at least one phase grating has a grating depth of substantially $\lambda/4$.

25. The method according to claim 21, wherein said measuring an amplitude includes measuring an amplitude of more than one diffraction order of the diffraction pattern, and
wherein at least one of the more than one diffraction orders has a low sensitivity to relative position changes of the first pattern with respect to the second pattern as compared to another order of the diffraction pattern.

26. The method according to claim 25, said method further comprising correcting a measured amplitude of at least one order of the diffraction pattern based on a measured amplitude of at least one other order of the diffraction pattern.

27. The method according to claim 21, said method further comprising calibrating an overlay measurement based on a relation between the measured amplitude and a corresponding relative displacement of the first pattern and the second pattern.

28. The method according to claim 21, said method further comprising measuring the amplitude again at a different relative position of the first pattern with respect to the second pattern.

* * * * *